(12) United States Patent
Kristal

(10) Patent No.: US 11,444,257 B2
(45) Date of Patent: Sep. 13, 2022

(54) QUANTUM DOT ELECTROLUMINESCENT ELEMENT, DISPLAY PANEL AND DISPLAY DEVICE

(71) Applicant: BEIJING BOE TECHNOLOGY DEVELOPMENT CO., LTD., Beijing (CN)

(72) Inventor: Boris Kristal, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 79 days.

(21) Appl. No.: 17/040,964

(22) PCT Filed: Mar. 18, 2020

(86) PCT No.: PCT/CN2020/079804
§ 371 (c)(1),
(2) Date: Sep. 23, 2020

(87) PCT Pub. No.: WO2020/224334
PCT Pub. Date: Nov. 12, 2020

(65) Prior Publication Data
US 2021/0159437 A1 May 27, 2021

(30) Foreign Application Priority Data
May 9, 2019 (CN) .......................... 201910383445.5

(51) Int. Cl.
*H01L 51/50* (2006.01)

(52) U.S. Cl.
CPC ........ *H01L 51/502* (2013.01); *H01L 51/5056* (2013.01); *H01L 51/5072* (2013.01); *H01L 51/5088* (2013.01); *H01L 2251/558* (2013.01)

(58) Field of Classification Search
CPC .............. H01L 51/502; H01L 51/5056; H01L 51/5072; H01L 51/5088
See application file for complete search history.

(56) References Cited

U.S. PATENT DOCUMENTS

| 6,614,176 B2 | 9/2003 | Kim et al. |
| 7,888,865 B2 | 2/2011 | Iwakuma et al. |
| 9,634,274 B2 | 4/2017 | Bai et al. |

(Continued)

FOREIGN PATENT DOCUMENTS

| CN | 104319353 A | 1/2005 |
| CN | 104752625 A | 7/2015 |

(Continued)

OTHER PUBLICATIONS

First Office Action issued in Chinese Patent Application No. 201910383445.5 dated Jan. 29, 2021.

(Continued)

*Primary Examiner* — Anthony Ho
(74) *Attorney, Agent, or Firm* — Chiwin Law LLC

(57) ABSTRACT

A quantum dot electroluminescent element, a display panel, and a display device are provided. The quantum dot electroluminescent element includes an anode layer, a composite light-emitting layer, and a cathode layer which are stacked. The composite light-emitting layer includes at least two quantum dot light-emitting layers which are stacked, and an intermediate layer arranged between every two adjacent ones of the at least two quantum dot light-emitting layers; the intermediate layer is configured to transport holes and block electrons.

15 Claims, 6 Drawing Sheets

(56) References Cited

U.S. PATENT DOCUMENTS

| | | |
|---|---|---|
| 10,418,580 B2 | 9/2019 | Heo et al. |
| 2006/0158105 A1 | 7/2006 | Kim et al. |
| 2007/0159088 A1 | 7/2007 | Sakamoto |
| 2008/0054872 A1 | 3/2008 | Kobayashi |
| 2010/0102712 A1 | 4/2010 | Jou et al. |
| 2017/0117496 A1 | 4/2017 | Koh et al. |
| 2018/0033988 A1 | 2/2018 | Walter et al. |
| 2020/0075877 A1 | 3/2020 | Yu |

FOREIGN PATENT DOCUMENTS

| | | |
|---|---|---|
| CN | 105552244 A | 5/2016 |
| CN | 107046103 A | 8/2017 |
| CN | 107093673 A | 8/2017 |
| CN | 108550707 A | 9/2018 |
| CN | 110323347 A | 10/2019 |
| JP | 2005259492 A | 9/2005 |
| JP | 2005276583 A | 10/2005 |
| JP | 2006202747 A | 8/2006 |
| KR | 20010092905 A | 10/2001 |
| KR | 20130074654 A | 7/2013 |

OTHER PUBLICATIONS

First Office Action issued in Chinese Patent Application No. 201910044674.4 dated Jan. 29, 2021.
Search Report issued with the First OA in Chinese Patent Application No. 201910383445.5 dated Jan. 29, 2021.

QUANTUM DOT ELECTROLUMINESCENT ELEMENT, DISPLAY PANEL AND DISPLAY DEVICE

This application is a U.S. National Phase Entry of International Application No. PCT/CN2020/079804 filed on Mar. 18, 2020, designating the United States of America and claiming priority to Chinese Patent Application No. 201910383445.5, filed on May 9, 2019. The present application claims priority to and the benefit of the above-identified applications and the above-identified applications are incorporated by reference herein in their entirety.

TECHNICAL FIELD

The present disclosure relates to a quantum dot electroluminescent element, a display panel, and a display device.

BACKGROUND

Electronic element using a quantum dot material to emit light is applied in various kinds of electronic devices, especially a television. However, most modern electronic devices use the quantum dot electroluminescent element as a color converter, and improve the light output based on a LED back plate through the photoluminescence performance of quantum dots.

Quantum dot electroluminescent diode (QLED) is a new electronic element for display applications, which directly injects electrons and holes into quantum dot emitters to achieve electroluminescence. This kind of display is especially suitable for portable electronic devices powered by a battery, including smart phone, tablet computer, handheld personal computer, computer monitor, etc. These electronic devices require displays with high information content, full color, fast video rate response time, and low power consumption. However, some quantum dot electroluminescent elements have the problem that the light-emitting efficiency will decrease when the voltage increases to a certain extent and then increases again.

SUMMARY

An embodiment of the disclosure provides a quantum dot electroluminescent element, comprising an anode layer, a composite light-emitting layer, and a cathode layer which are stacked, wherein the composite light-emitting layer comprises at least two quantum dot light-emitting layers which are stacked, and an intermediate layer arranged between every two adjacent ones of the at least two quantum dot light-emitting layers; the intermediate layer is configured to transport holes and block electrons.

In some examples, the intermediate layer is respectively in direct contact with the quantum dot light-emitting layers on both sides of the intermediate layer, and the intermediate layer consists of a material which transports holes and blocks electrons.

In some examples, the composite light-emitting layer comprises two quantum dot light-emitting layers which are stacked.

In some examples, the two quantum dot light-emitting layer have the same material.

In some examples, film thicknesses of the two quantum dot light-emitting layers decrease successively in a direction from the cathode layer to the anode layer.

In some examples, the film thickness of each of the two quantum dot light-emitting layers is greater than 5 nm and less than 15 nm.

In some examples, the intermediate layer has a thickness less than 10 nm.

In some examples, the composite light-emitting layer has a film thickness greater than 10 nm and less than 30 nm.

In some examples, a material of the intermediate layer is at least one selected from the group consisting of poly[9,9-dioctylfluorene-CO—N-(4-butylphenyl)diphenylamine], polyvinyl carbazole, N,N'-diphenyl-N,N'-bis(3-methylphenyl)-1, 1'-biphenyl-4,4'-diamine, 4,4'-bis (9-carbazole) biphenyl, N,N'-diphenyl-N,N'-(1-naphthalene)-1,1'-biphenyl-4,4'-diamine, polyaniline, and N,N'-bis(naphthalene-1-yl)-N,N'-bis(phenyl)benzidine.

In some examples, an electron transport layer is further provided at a side of the composite light-emitting layer close to the cathode layer; a hole transport layer is further provided between the anode layer and the composite light-emitting layer; and a hole injection layer is further provided between the hole transport layer and the anode layer.

In some examples, the quantum dot electroluminescent element comprises at least two light-emitting structure layers which are stacked, wherein each of the two light-emitting structure layers comprises the composite light-emitting layer, and the at least two light-emitting structure layers are configured to emit light of different colors.

In some examples, a charge generation layer is provided between two adjacent ones of the at least two light-emitting structure layers, and the charge generation layer comprises an n-type doped organic layer and a p-type doped organic layer.

In some examples, each of the at least two light-emitting structure layers further comprises a hole injection layer and a hole transport layer on a side of the composite light-emitting layer close to the anode layer, and an electron transport layer on a side of the composite light-emitting layer close to the cathode layer.

An embodiment of the disclosure further provides a quantum dot electroluminescent display panel, comprising a plurality of pixel units arranged in an array, wherein each of the plurality of pixel units comprises the quantum dot electroluminescent element according to any embodiment of the disclosure.

An embodiment of the disclosure further provides a display device, comprising the quantum dot electroluminescent display panel according to any embodiment of the disclosure.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

In order to keep the following description of the embodiments of the disclosure clear and concise, the disclosure omits the detail description of some existing function and components.

Figure 1:
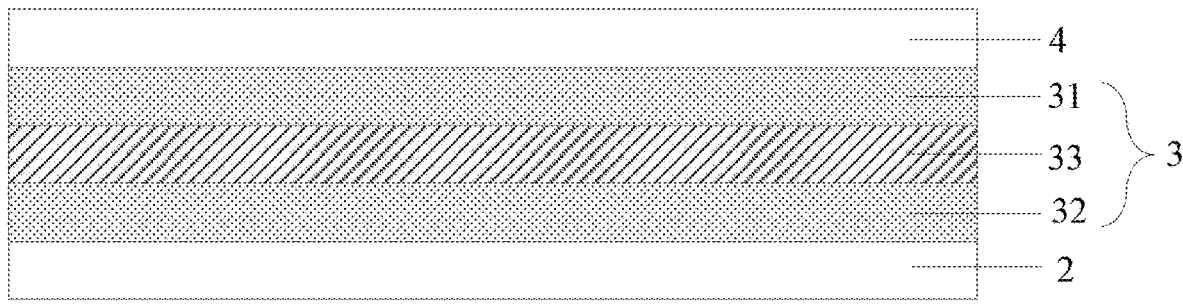
FIG. 1 is a schematic structural diagram of a quantum dot electroluminescent element provided by an embodiment of the present disclosure.

Referring to FIG. 1, an embodiment of the present disclosure provides a quantum dot electroluminescent element, which includes an anode layer 2, a composite light-emitting layer 3, and a cathode layer 4 which are stacked. The composite light-emitting layer 3 is located at a side of anode layer 2, and the cathode layer 4 is located at a side of composite light-emitting layer 3 away from the anode layer 2.

The composite light-emitting layer 3 includes at least two quantum dot light-emitting layers which are stacked. For example, referring to FIG. 1, the composite light-emitting layer 3 may include a first quantum dot light-emitting layer 31 and a second quantum dot light-emitting layer 32; an intermediate layer 33 is provided between every two adjacent ones of the at least two quantum dot light-emitting layers; the intermediate layer 33 is configured to transport holes and block electrons.

An embodiment of the disclosure provides a quantum dot electroluminescent element, which includes an anode layer 2, a composite light-emitting layer 3, and a cathode layer 4 which are stacked. The composite light-emitting layer 3 includes at least two quantum dot light-emitting layers which are stacked, and an intermediate layer 33 arranged between every two adjacent ones of the at least two quantum dot light-emitting layers. The intermediate layer 33 is configured to transport holes and block electrons. According to the quantum dot electroluminescent element of the embodiment of the present disclosure, the quantum dot light-emitting layer is divided into two or more sub-quantum dot light-emitting layers, and an intermediate layer 33 capable of transporting holes and blocking electrons is arranged between adjacent sub-quantum dot light-emitting layers. In this way, at low voltage, the intermediate layer 33 can block electrons and prevent electrons from escaping from the quantum dot light-emitting layer (such as the first quantum dot light-emitting layer 31) close to the cathode layer 4, so that electrons and holes mainly emit light in the quantum dot light-emitting layer (the first quantum dot light-emitting layer 31) close to the cathode layer. When the voltage increases, some electrons escape from the quantum dot light-emitting layer (e.g., the first quantum dot light-emitting layer 31) close to the cathode layer, but the escaped electrons can recombine with holes in the adjacent quantum dot light-emitting layer (such as the second quantum dot light-emitting layer 32) to emit light, thus alleviate the problem that the light-emitting efficiency of the quantum dot electroluminescent element will decrease when the voltage increases.

For example, the intermediate layer 33 is respectively in direct contact with the quantum dot light-emitting layers on both sides of the intermediate layer 33 (for example, the first quantum dot light-emitting layer 31 and the second quantum dot light-emitting layer 32). For example, the intermediate layer 33 consists of a material which transports holes and blocks electrons. Examples of some materials for the intermediate layer will be shown below.

Figure 2:
FIG. 2 is a schematic structural diagram of a quantum dot electroluminescent element provided by an embodiment of the present disclosure.

In some examples, as illustrated by FIG. 2, the side of the composite light-emitting layer 3 close to the cathode layer 4 may be further provided with an electron transport layer 5; a hole transport layer 6 may be further provided between the anode layer 2 and the composite light-emitting layer 3; and a hole injection layer 7 may be further provided between the hole transport layer 6 and the anode layer 2.

For example, the anode layer 2 and the layers on the anode layer 2 may be located on a base substrate 1. For example, the anode layer 2 may be formed of an indium tin oxide (ITO) film, an indium zinc oxide (IZO) film, or other transparent conductive materials. For example, the hole injection layer 7 can be formed of an organic material (such as PEDOT:PSS, LG101 or the like) by a solution spin coating process or an evaporation process. For example, the hole transport layer 6 can be formed of organic materials (such as TPD, CBP, NPD, polyaniline, NPB, etc.) by a solution spin coating process or an evaporation process. For example, the electron transport layer 5 can be zinc oxide. The cathode layer 4 can be formed by vacuum deposition, for example, and is made of aluminum, silver or other metals with similar working functions.

Figure 3:
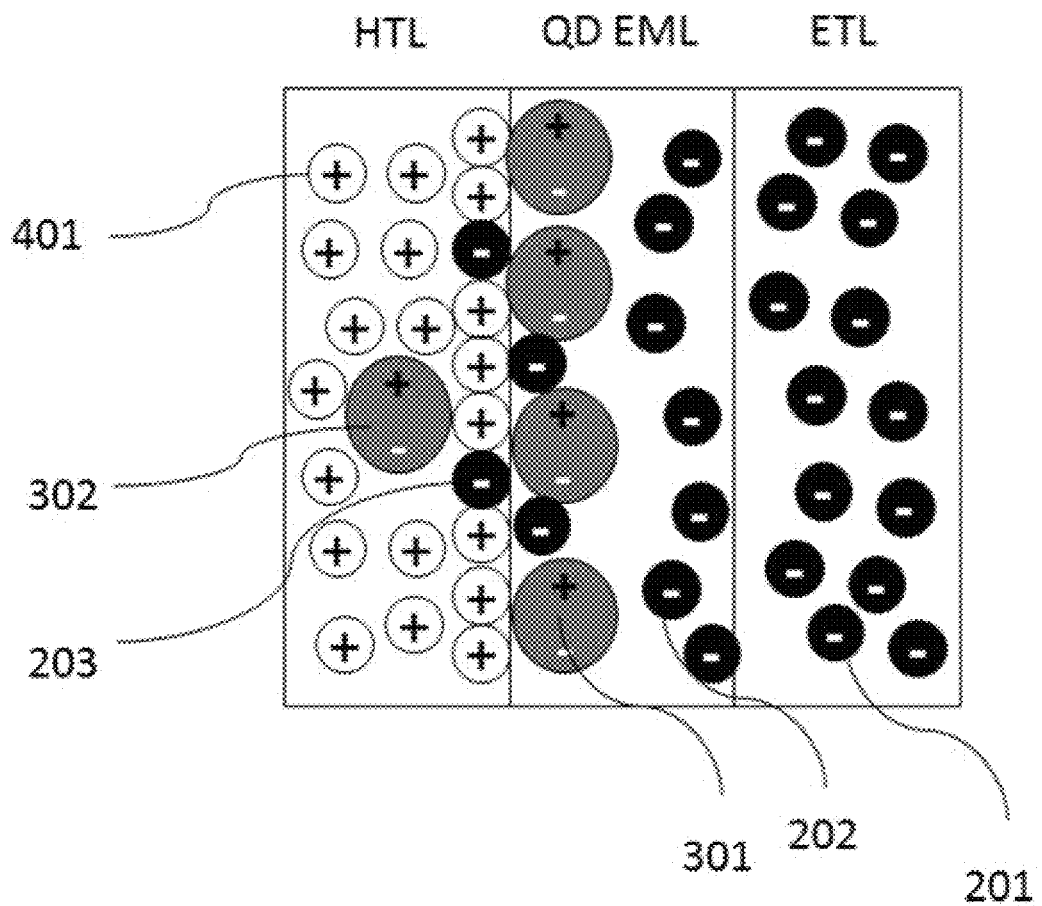
FIG. 3 is a schematic diagram of a combination of electrons and holes in a quantum dot electroluminescent element.

In a quantum dot electroluminescent element, as illustrated by FIG. 3, a quantum dot light-emitting layer QD EML is sandwiched between a zinc oxide electron transport layer ETL and a hole transport layer HTL. Electrons and holes are combined to form excitons 301 when being injected into the quantum dot light-emitting layer QD EML. When the bias voltage increases, the electron current density is much higher than the hole current density, resulting in the accumulation of electrons 202 in the quantum dot light-emitting layer QD EML. This accumulation leads to the charge of quantum dots and the diffusion of non-radiative recombination through the Auger process. Some extra electrons 203 escape to the hole transport layer HTL. Some escaped electrons recombine with holes in the hole transport layer HTL to form excitons 302 that do not participate in quantum dot emission. At higher current density (larger than 50-70 mA/cm$^2$), charge balance becomes a big problem. At an initial stage of applying bias voltage to the QLED element, low-density holes 401 and low-density electrons 201 are injected into the QD-based light-emitting layer (quantum dot light-emitting layer QD EML), thereby forming balanced hole and electron injection, and then forming excitons and emitting light. At this stage, the recombination region is well located in the quantum dot light-emitting layer, and the light-emitting efficiency of the QLED element is relatively high. With the further increase of current density (when higher brightness is needed), the electron density is obviously higher than the hole density. This causes the recombination region to approach the side of the anode (for example, to approach the quantum dot light-emitting layer/hole transport layer (EML/HTL) interface), and some electrons leak out from the quantum dot light-emitting layer (EML). In addition, excessive electrons are accumulated in the quantum dot light-emitting layer QD EML. This process will lead to three negative consequences: 1) excessive electrons do not participate in radiation recombination, which reduces the light-emitting efficiency of the device; 2) even if excitons are formed by recombination with holes outside the quantum dot light-emitting layer QD EML, the leaked electrons will cause the hole transport layer HTL emission with wrong wavelength (i.e., emitting undesired wavelength light) and low intensity, which will further reduce the efficiency of the element and interfere with the light-emitting purity of the device; 3) the negatively charged quantum dot light-emitting layer leads to the increase of non-radiative electron-hole recombination through the Auger process, which further reduces the light-emitting efficiency of the QLED element.

Figure 4:
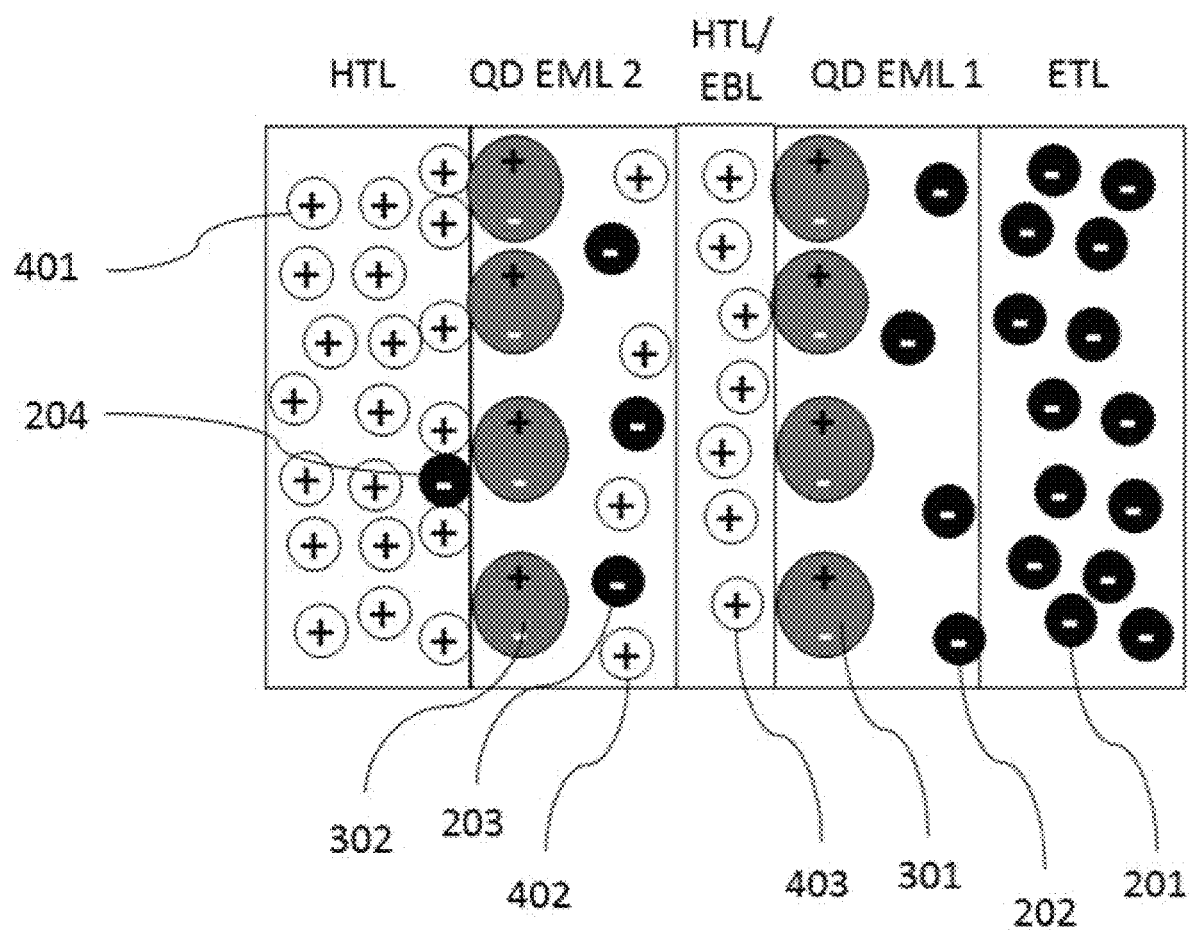
FIG. 4 is a schematic diagram of a recombination of electrons and holes in a quantum dot electroluminescent element provided by an embodiment of the present disclosure.

In the quantum dot electroluminescent element provided by the embodiment of the present disclosure, as illustrated by FIG. 4, in this structure, the quantum dot electroluminescent element has two quantum dot light-emitting layers QD EML, including QD EML 1 and QD EML 2, which are separated by the hole transport/electron blocking layer (HTL/EBL) and sandwiched between zinc oxide electron transport layer ETL and organic hole transport layer HTL. The zinc oxide electron transport layer ETL and the organic hole transport layer HTL respectively provide electrons 201 and holes 401 to the quantum dot light-emitting layers QD EML. Under low bias voltage, electrons and holes are mainly injected into the QD EML 1 and recombine in this layer to form excitons 301. The HTL/EBL effectively blocks electrons under low bias voltage. With the increase of current bias, the holes 403 accumulated in the HTL/EBL generate dipole moment, allowing some electrons 202 to go through the potential barrier of the HTL/EBL layer and enter the QD EML 2, where they recombine with holes to form excitons 302. Compared with the structure shown in FIG. 3, this results in a much smaller number of electrons 202 accumulated in the QD EML 1. There are also free electrons 203 and holes 402 in the QD EML 2. In this structure, compared with the structure shown in FIG. 3, only a few electrons 204 escape into the HTL layer. The quantum dot electroluminescent element provided by the embodiment of the disclosure can help reduce or alleviate the negative influence of the quantum dot electroluminescent element when the voltage increases. The quantum dot light-emitting layer EML is divided into two or more thin quantum dot light-emitting layers EML with a thin hole transport/electron blocking layer (HTL/EBL) therebetween. The thin hole transport/electron blocking layer can effectively prevent electrons from escaping from the first quantum dot light-emitting layer (QD EML1) close to the cathode layer under low bias voltage, thus producing a performance very similar to that of the traditional QLED element. However, with the increase of bias voltage (i.e., the increase of current density), some electrons start to enter the adjacent second quantum dot light-emitting layer (QD EML2) through the barrier tunnel, and combine with holes in the second quantum dot light-emitting layer to form a second recombination region. That is, it is equivalent to that the quantum dot electroluminescent element provided by the embodiment of the present disclosure has two recombination regions instead of one, so that excitons will be effectively diffused to a larger region, thereby reducing the attenuation degree of light-emitting efficiency. Accordingly, the quantum dot electroluminescent element provided by the embodiment of the present disclosure can achieve at least one of the following technical effects: 1) some electrons escape from the first quantum dot light-emitting layer (QD EML1) close to the cathode layer to the second quantum dot light-emitting layer (QD EML2) adjacent to the first quantum dot light-emitting layer, and participate in electron-hole recombination in the second quantum dot light-emitting layer, which increases the number of electrons participating in recombination, thereby improving light-emitting efficiency; 2) there may be holes in the second quantum dot light-emitting layer (QD EML2), and then the leaked electrons can recombine in the second quantum dot light-emitting layer to form excitons instead of in the hole transport layer (HTL); 3) because the electrons are distributed more evenly in the two quantum dot light-emitting layers, the negative charge in the quantum dot light-emitting layers decreases, resulting in a higher ratio between the radiative recombination and the non-radiative recombination. Of course, the foregoing is only an explanation to the case where the composite light-emitting layer includes two quantum dot light-emitting layers, and the present disclosure is not limited thereto.

Figure 5:
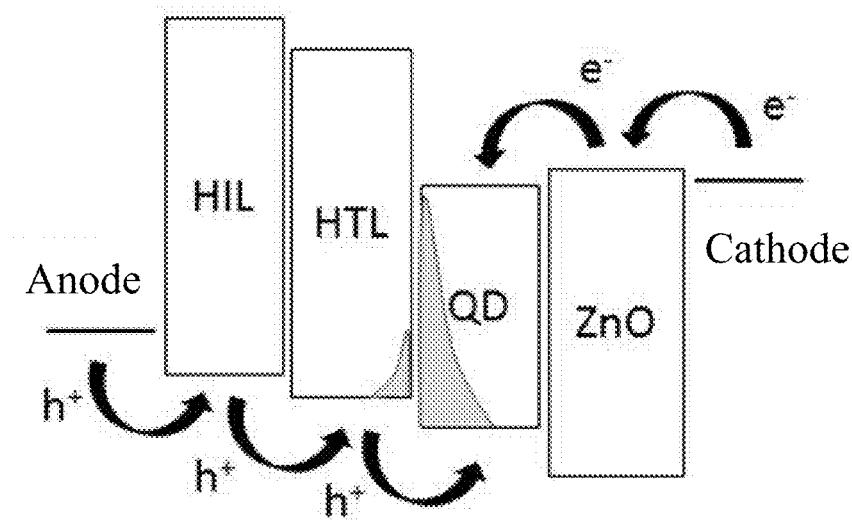
FIG. 5 is a schematic energy transition diagram of a quantum dot electroluminescent element and another quantum dot electroluminescent element which is provided by an embodiment of the present disclosure.
Figure 5:
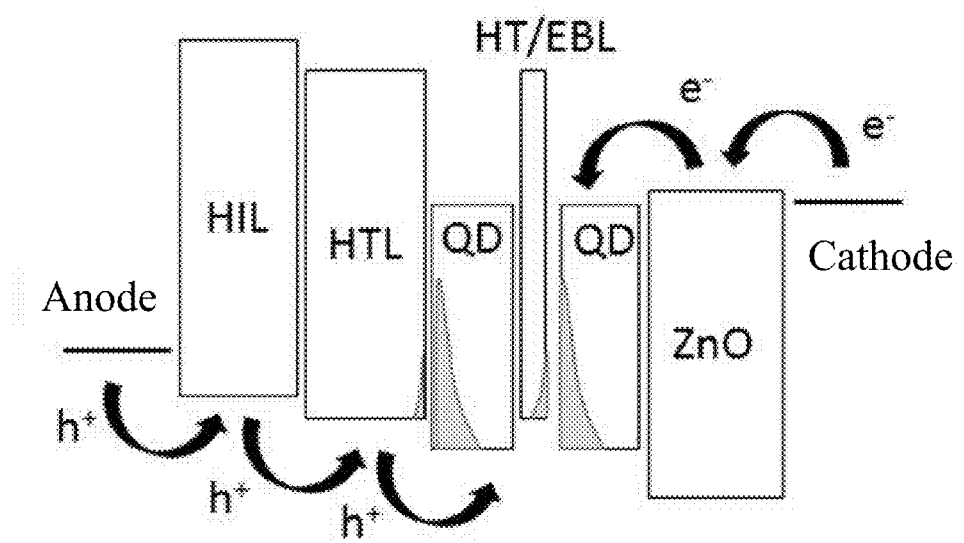
Figure 6:
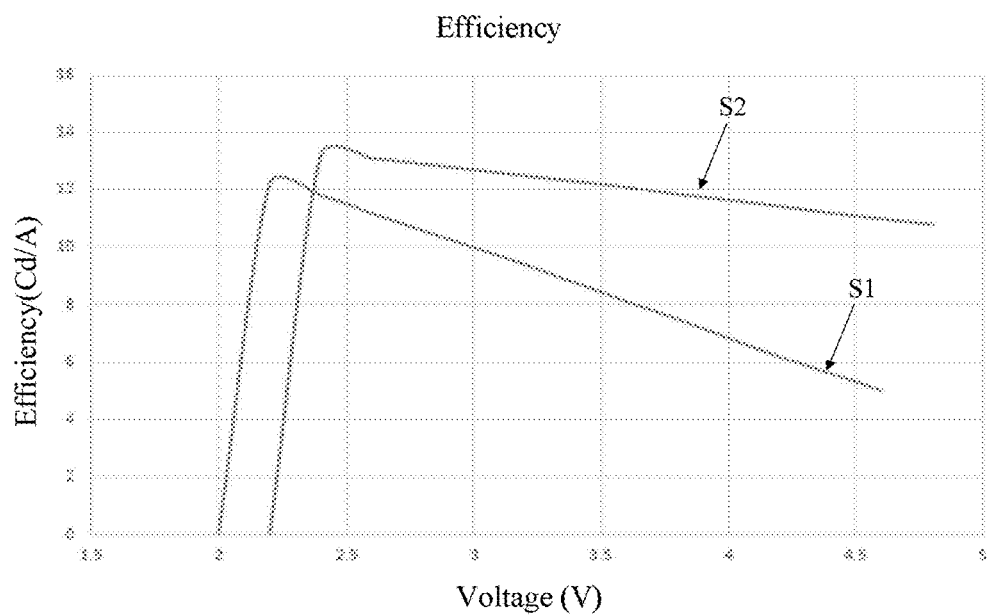
FIG. 6 is a schematic diagram of electroluminescence comparison between a quantum dot electroluminescent element and a quantum dot electroluminescent element provided by an embodiment of the present disclosure.

The upper diagram of FIG. 5 is a schematic energy level diagram of the transition of electrons and holes corresponding films with a single quantum dot light-emitting layer shown in FIG. 3, and the lower diagram of FIG. 5 is a schematic energy level diagram of the transition of electrons and holes corresponding films with multiple quantum dot light-emitting layers provided by the embodiment of the disclosure. Compared with the quantum dot electroluminescent element shown in FIG. 3, the quantum dot electroluminescent element provided by the embodiment of the present disclosure has electrons and holes in the multiple quantum dot light-emitting films, and can emit light in the multiple quantum dot light-emitting films, and has a wider recombination region. S1 in FIG. 6 is an electroluminescence diagram of the quantum dot electroluminescent element with single quantum dot light-emitting layer shown in FIG. 3, and S2 in FIG. 6 is an electroluminescence diagram of multiple quantum dot light-emitting layers provided by the present disclosure. It can be seen from FIG. 6 that the quantum dot electroluminescent element provided by the embodiment of the present disclosure has less attenuation degree of light-emitting efficiency than the quantum dot electroluminescent element shown in FIG. 3 when the voltage increases.

For example, the composite light-emitting layer 3 includes two quantum dot light-emitting layers which are stacked.

For example, the quantum dot light-emitting layers have the same material. In the embodiment of the present disclosure, the materials of the quantum dot light-emitting layers are the same, that is, one traditional quantum dot light-emitting layer is split into two quantum dot light-emitting layers, which can better solve the problem that the light-emitting efficiency of the quantum dot electroluminescent element is reduced under high voltage.

Figure 7:
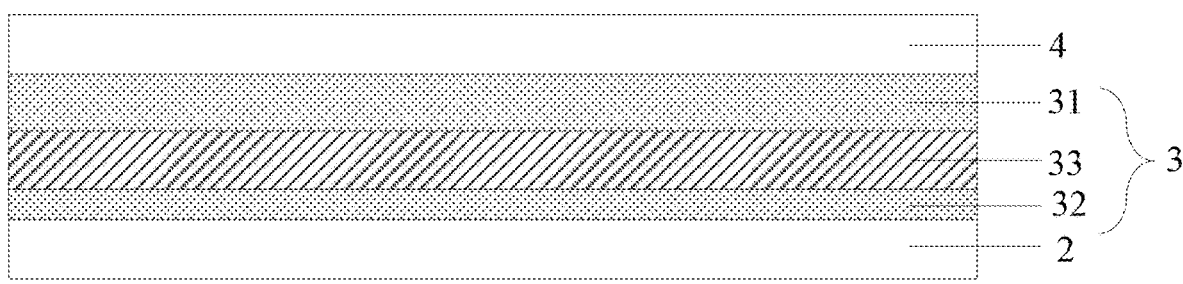
FIG. 7 is a structural schematic diagram of different quantum dot light-emitting layers with different film thicknesses provided by an embodiment of the present disclosure.

For example, film thicknesses of the quantum dot light-emitting layers of the composite light-emitting layer can be different, which is beneficial for the quantum dot electroluminescent element to have higher light-emitting efficiency. For example, as illustrated by FIG. 7, in a direction from the cathode layer 4 to the anode layer 2, the film thicknesses of the quantum dot light-emitting layers decrease successively. For example, the film thickness of the second quantum dot light-emitting layer 32 is smaller than that of the first quantum dot light-emitting layer 31. In the embodiment of the present disclosure, from the first quantum dot light-emitting layer 31 (QD EML1) close to the cathode layer to the second quantum dot light-emitting layer 32 (QD EML2) away from the cathode layer, the intermediate layer 33 (HTL/EBL) provides a substantial barrier for the injection of electrons, while the holes injected from QD EML2 into QD EML1 have almost no barrier, so the main exciton recombination will occur in QD EML1. In order to enlarge the exciton recombination region, a thicker QDEML is needed. In this case, only a relatively small proportion of electrons can escape to QD EML2 (especially at lower voltage), thus, compared with QD EML1, the number of exciton recombination is less, that is, QD EML2 layer needs a thinner film thickness. In addition, if the quantum dot electroluminescent element provided by the embodiment of the present disclosure includes more than two quantum dot light-emitting layers, the same logic applies, that is, the film thicknesses of the quantum dot light-emitting layers of the composite light-emitting layer 3 decrease successively in the direction from the cathode layer 4 to the anode layer 2. Of course, for simplicity of manufacturing, the film thicknesses of the quantum dot light-emitting layers may also be the same.

For example, the film thickness of each of the quantum dot light-emitting layers is greater than 5 nm and less than 15 nm.

For example, the thickness of the intermediate layer 33 is less than 10 nm.

For example, the film thickness of the composite light-emitting layer 3 is greater than 10 nm and less than 30 nm. In the embodiment of the present disclosure, the total thickness of the composite light-emitting layer 3 is greater than 10 nm and less than 30 nm. In order to avoid a large increase in the internal driving voltage of the quantum dot electroluminescent element, the thickness of the composite light-emitting layer 3 may be approximately the same as that of a single quantum dot light-emitting layer (10-30 nm) of the conventional quantum dot electroluminescent element.

For example, the material of the intermediate layer 33 is any one or a combination of several ones selected from the group consisting of poly[9,9-dioctylfluorene-CO—N-(4-butylphenyl)diphenylamine], polyvinyl carbazole, N,N'-di-phenyl-N,N'-bis(3-methylphenyl)-1, 1'-biphenyl-4,4'-di-amine, 4,4'-bis (9-carbazole) biphenyl, N,N'-diphenyl-N,N'-(1-naphthalene)-1,1'-biphenyl-4,4'-diamine, polyaniline, and N,N'-bis(naphthalene-1-yl)-N,N'-bis(phenyl)benzidine.

Figure 8:
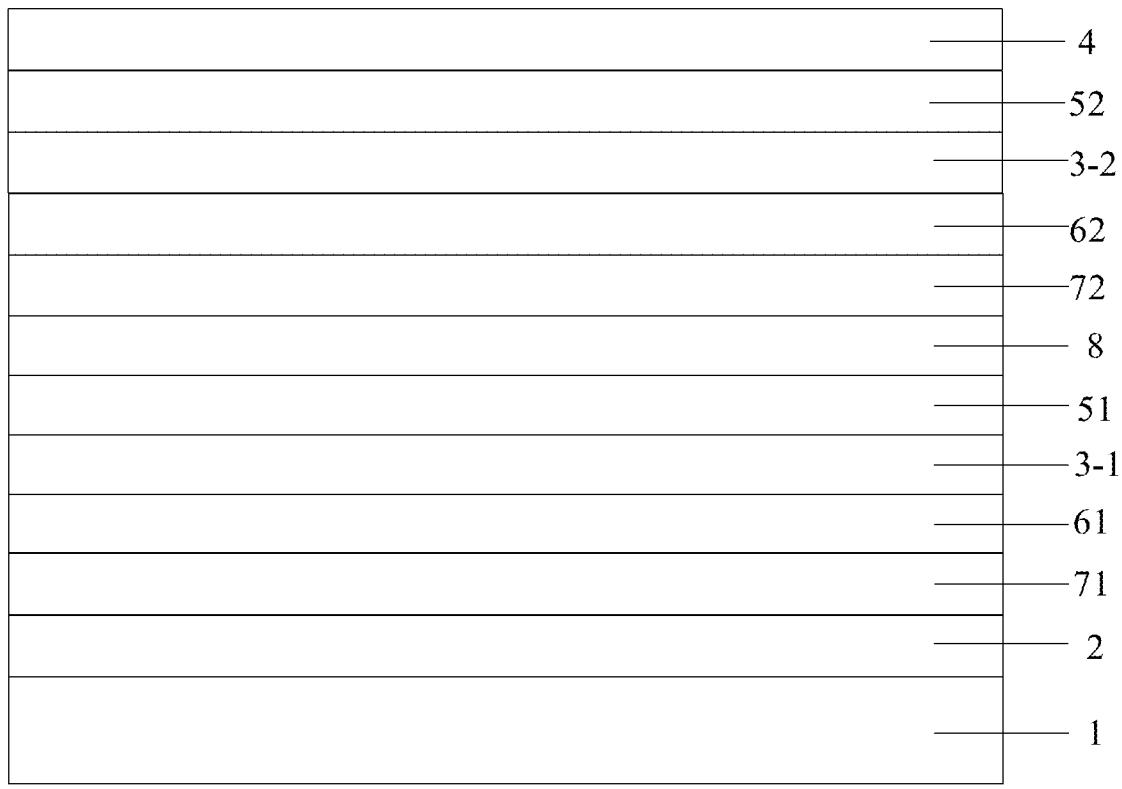
FIG. 8 is a schematic structural diagram of a quantum dot electroluminescent element provided by an embodiment of the present disclosure.

For example, the quantum dot electroluminescent element of the embodiment of the present disclosure may be a quantum dot electroluminescent element emitting monochromatic light or a quantum dot electroluminescent element emitting white light. For example, a quantum dot electroluminescent element with white light can be formed by mixing two or three stacked structures emitting light with different colors. For example, light-emitting layer of each of the stacked structures may be constituted by the composite light-emitting layer in the embodiment of the present disclosure. The quantum dot electroluminescent element of the embodiment of the disclosure can also be a light-emitting element in a pixel unit of a quantum dot electroluminescent display panel. An embodiment according to the present disclosure includes a plurality of the above-mentioned composite light-emitting layers, which are stacked between the anode layer and the cathode layer, and a charge generation layer is provided between adjacent ones of the composite light-emitting layers. For example, as illustrated by FIG. 8, the quantum dot electroluminescent element includes an anode layer 2, a first hole injection layer 71, a first hole transport layer 61, a first composite light-emitting layer 3-1, a first electron transport layer S1, a charge generation layer 8, a second hole injection layer 72, a second hole transport layer 62, a second composite light-emitting layer 3-2, a second electron transport layer S2, and a cathode layer 4 sequentially stacked on the base substrate 1. For example, the first composite light-emitting layer 3-1 and the second composite light-emitting layer 3-2 both are the composite light-emitting layers described in any of the above embodiments, but the first composite light-emitting layer 3-1 and the second composite light-emitting layer 3-2 can be composite light-emitting layers capable of emitting light of different colors. The first composite light-emitting layer forms a first light-emitting structure layer with the first hole injection layer, first hole transport layer, and first electron transport layer on both sides of the first composite light-emitting layer, and the second composite light-emitting layer forms a second light-emitting structure layer with the second hole injection layer, second hole transport layer, and second electron transport layer on both sides of the second composite light-emitting layer. The first light-emitting structure layer and the second light-emitting structure layer are separated by a charge generation layer 8. For example, the charge generation layer 8 may include an n-type doped organic layer and a p-type doped organic layer to inject electrons and holes, respectively. The embodiment of FIG. 8 only schematically shows two light-emitting structure layers, and the embodiment according to the present disclosure is not limited thereto, and may include more light-emitting structure layers of different colors, and adjacent light-emitting structure layers are separated by a charge generation layer. For example, the light-emitting structure layers may include light-emitting structure layers emitting red, green and blue colors, respectively, to form a light-emitting element emitting white light.

An embodiment of the present disclosure further provides a quantum dot electroluminescent display panel, which comprises a plurality of pixel units distributed in an array. Each of the pixel units includes the quantum dot electroluminescent element provided by the embodiment of the present disclosure.

The embodiment of the present disclosure further provides a display device, which includes the quantum dot electroluminescent display panel provided by the embodiment of the present disclosure.

The embodiments of the present disclosure can have any one or more of the follow beneficial effects: an embodiment of the present disclosure provides a quantum dot electroluminescent element, which includes an anode layer, a composite light-emitting layer, and an anode layer which are stacked. The composite light-emitting layer includes at least two quantum dot light-emitting layers which are stacked, and an intermediate layer arranged between every two adjacent ones of the at least two quantum dot light-emitting layers; the intermediate layer is configured to transport holes and block electrons. The quantum dot electroluminescent element disclosed by the embodiment of the present disclosure is equivalent to dividing a quantum dot light-emitting layer into two or more quantum dot light-emitting layers, and inserting an intermediate layer capable of transporting holes and blocking electrons between the adjacent quantum dot light-emitting layers. In this way, at low voltage, the intermediate layer can block electrons and prevent electrons from escaping from the quantum dot light-emitting layer close to the cathode layer, so that electrons and holes mainly emit light in the quantum dot light-emitting layer close to the cathode layer; when the voltage increases, some electrons escape from the quantum dot light-emitting layer close to the cathode layer, but the escaped electrons can recombine with holes in the adjacent quantum dot light-emitting layer to emit light, thus alleviating the problem that the light-emitting efficiency of quantum dot electroluminescent elements will decrease when the voltage increases.

The foregoing are merely exemplary embodiments of the invention, but is not used to limit the protection scope of the invention. The protection scope of the invention shall be defined by the attached claims.

The invention claimed is:

1. A quantum dot electroluminescent element, comprising an anode layer, a composite light-emitting layer, and a cathode layer which are stacked,
wherein the composite light-emitting layer comprises at least two quantum dot light-emitting layers which are stacked, and an intermediate layer arranged between every two adjacent ones of the at least two quantum dot light-emitting layers; the intermediate layer is configured to transport holes and block electrons.

2. The quantum dot electroluminescent element according to claim 1, wherein the intermediate layer is respectively in direct contact with the quantum dot light-emitting layers on both sides of the intermediate layer, and the intermediate layer consists of a material which transports holes and blocks electrons.

3. The quantum dot electroluminescent element according to claim 1, wherein the composite light-emitting layer comprises two quantum dot light-emitting layers which are stacked.

4. The quantum dot electroluminescent element according to claim 3, wherein the two quantum dot light-emitting layer have the same material.

5. The quantum dot electroluminescent element according to claim 3, wherein film thicknesses of the two quantum dot light-emitting layers decrease successively in a direction from the cathode layer to the anode layer.

6. The quantum dot electroluminescent element according to claim 5, wherein the film thickness of each of the two quantum dot light-emitting layers is greater than 5 nm and less than 15 nm.

7. The quantum dot electroluminescent element according to claim 1, wherein the intermediate layer has a thickness less than 10 nm.

8. The quantum dot electroluminescent element according to claim 7, wherein the composite light-emitting layer has a film thickness greater than 10 nm and less than 30 nm.

9. The quantum dot electroluminescent element according to claim 1, wherein a material of the intermediate layer is at least one selected from the group consisting of poly[9,9-dioctylfluorene-CO—N-(4-butylphenyl)diphenylamine], polyvinyl carbazole, N,N'-diphenyl-N,N'-bis(3-methylphenyl)-1, 1'-biphenyl-4,4'-diamine, 4,4'-bis (9-carbazole) biphenyl, N,N'-diphenyl-N,N'-(1-naphthalene)-1,1'-biphenyl-4,4'-diamine, polyaniline, and N,N'-bis(naphthalene-1-yl)-N,N'-bis(phenyl)benzidine.

10. The quantum dot electroluminescent element according to claim 1, wherein an electron transport layer is further provided at a side of the composite light-emitting layer close to the cathode layer;
a hole transport layer is further provided between the anode layer and the composite light-emitting layer; and
a hole injection layer is further provided between the hole transport layer and the anode layer.

11. The quantum dot electroluminescent element according to claim 1, comprising at least two light-emitting structure layers which are stacked, wherein each of the two light-emitting structure layers comprises the composite light-emitting layer, and the at least two light-emitting structure layers are configured to emit light of different colors.

12. The quantum dot electroluminescent element according to claim 11, wherein a charge generation layer is provided between two adjacent ones of the at least two light-emitting structure layers, and the charge generation layer comprises an n-type doped organic layer and a p-type doped organic layer.

13. The quantum dot electroluminescent element according to claim 11, wherein each of the at least two light-emitting structure layers further comprises a hole injection layer and a hole transport layer on a side of the composite light-emitting layer close to the anode layer, and an electron transport layer on a side of the composite light-emitting layer close to the cathode layer.

14. A quantum dot electroluminescent display panel, comprising a plurality of pixel units arranged in an array, wherein each of the plurality of pixel units comprises the quantum dot electroluminescent element according to claim 1.

15. A display device, comprising the quantum dot electroluminescent display panel according to claim 14.

* * * * *